US006888615B2

United States Patent
Tsacoyeanes et al.

(10) Patent No.: US 6,888,615 B2
(45) Date of Patent: May 3, 2005

(54) SYSTEM AND METHOD FOR IMPROVING LINEWIDTH CONTROL IN A LITHOGRAPHY DEVICE BY VARYING THE ANGULAR DISTRIBUTION OF LIGHT IN AN ILLUMINATOR AS A FUNCTION OF FIELD POSITION

(75) Inventors: James G. Tsacoyeanes, Southbury, CT (US); Scott D. Coston, New Milford, CT (US)

(73) Assignee: ASML Holding N.V., Veldhoven (NL)

( * ) Notice: Subject to any disclaimer, the term of this patent is extended or adjusted under 35 U.S.C. 154(b) by 94 days.

(21) Appl. No.: 10/127,505

(22) Filed: Apr. 23, 2002

(65) Prior Publication Data

US 2003/0197842 A1 Oct. 23, 2003

(51) Int. Cl.⁷ .......................... G03B 27/42; G03B 27/54
(52) U.S. Cl. ............................... 355/53; 355/67
(58) Field of Search ............................ 355/52, 53, 55, 355/67–71; 250/548; 356/399–401; 359/618–691

(56) References Cited

U.S. PATENT DOCUMENTS

| | | | |
|---|---|---|---|
| 4,988,188 A | 1/1991 | Ohta | 355/122 |
| 5,296,892 A | 3/1994 | Mori | 355/67 |
| 5,329,336 A | 7/1994 | Hirano et al. | 355/53 |
| 5,357,312 A | 10/1994 | Tounai | 355/67 |
| 5,631,721 A * | 5/1997 | Stanton et al. | 355/71 |
| 5,724,122 A * | 3/1998 | Oskotsky | 355/67 |
| 5,726,740 A | 3/1998 | Shiozawa et al. | |
| 5,895,737 A | 4/1999 | McCullough et al. | 430/30 |
| 5,896,188 A * | 4/1999 | McCullough | 355/67 |
| 5,966,202 A | 10/1999 | McCullough | 355/67 |
| 6,013,401 A * | 1/2000 | McCullough et al. | 430/30 |
| 6,072,852 A | 6/2000 | Hudyma et al. | |
| 6,259,513 B1 * | 7/2001 | Gallatin et al. | 355/71 |
| 2001/0043318 A1 * | 11/2001 | Mori | 355/53 |
| 2001/0046038 A1 * | 11/2001 | Mulkens et al. | 355/67 |
| 2002/0014600 A1 | 2/2002 | Sato et al. | |
| 2003/0197846 A1 * | 10/2003 | Coston et al. | 355/67 |

FOREIGN PATENT DOCUMENTS

EP 1 248 151 A2 10/2002

OTHER PUBLICATIONS

Search Report from the Intellectual Property Office of Singapore, issued Jun. 9, 2004 for Appl. No. 200302345–4, 6 pages.
Derwent Abstract Accession No. 96–385544/39; Class P81, P84; English Language Abstract of DE 196 06 170 A1; (Sharp KK); Aug. 22, 1996; 1 page.
Derwent Abstract Accession No. 2002–037678/05; Class P84; English Language Abstract of JP 2001–267205 A; (NEC Corp); Sep. 28, 2001; 1 page.
Derwent Abstract Accession No. 2000–611651/58; Class P84, U11; English Language Abstract of WO 200057459–A1 (Nikon Corp); Sep. 28, 2000; 2 pages.

* cited by examiner

*Primary Examiner*—Henry Hung Nguyen
(74) *Attorney, Agent, or Firm*—Sterne, Kessler, Goldstein & Fox P.L.L.C.

(57) ABSTRACT

Electromagnetic energy is emitted from an illumination source of a lithography device. A portion of the emitted electromagnetic energy passes through an illumination optics module. The illumination optics module includes a one-dimensional optical transform element having a pupil plane. An aperture device having an adjustable aperture is located proximate to the pupil plane so that a portion of the electromagnetic energy received by the one-dimensional optical transform element passes through the aperture of the aperture device. The angular distribution of the electromagnetic energy passing through the illumination optics module is adjusted as a function of illumination field position using the aperture device, thereby improving line width control in the lithography device.

27 Claims, 10 Drawing Sheets

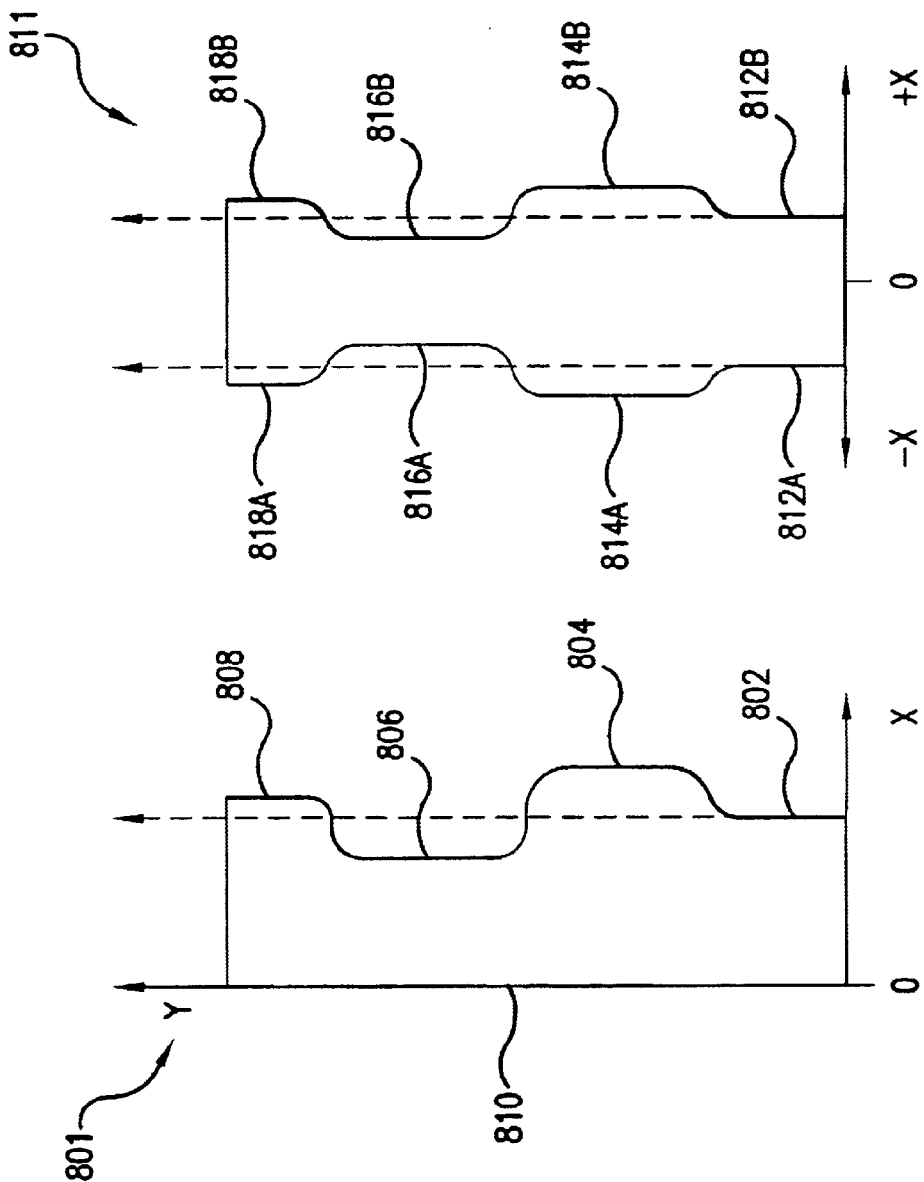

SYSTEM AND METHOD FOR IMPROVING LINEWIDTH CONTROL IN A LITHOGRAPHY DEVICE BY VARYING THE ANGULAR DISTRIBUTION OF LIGHT IN AN ILLUMINATOR AS A FUNCTION OF FIELD POSITION

CROSS-REFERENCE TO RELATED APPLICATIONS

The following application of common assignee is related to the present application, and is herein incorporated by reference in its entirety:

"System and Method for Improving Line Width Control in a Lithography Device Using an Illumination System Having Pre-Numerical Aperture Control," Ser. No. (to be determined), filed on the same day herewith.

FIELD OF THE INVENTION

This invention relates to lithography. More particularly, it relates to line width control in a lithography device.

BACKGROUND OF THE INVENTION

Lithography is used in the manufacture of semiconductor chips. Lithography, or more particularly photolithography, involves projecting one or more images of a reticle or semiconductor circuit mask onto a photosensitive substrate of a wafer. The wafer is then processed to form one or more circuits. As the art of semiconductor chip manufacturing progresses and the size of semiconductor devices become smaller, there is a need for improving line width control in photolithography devices.

Large semiconductor chips are typically manufactured using a step-and scan lithography device. A step-and-scan lithography device operates by scanning a typically rectangular illumination field defined by an illumination system over a reticle having a circuit pattern thereon. A step-and-scan lithography device is used to manufacture large semiconductor chips, in part, because the size of a semiconductor chip that can be manufactured using a step-and-scan lithography device is not limited to the size of the device's projection optics.

A method and system for improving line width control, for example, in a step-and-scan lithography device, is described by McCullough et al. in U.S. application Ser. No. 09/599,383, filed Jun. 22, 2000, "Illumination System With Spatially Controllable Partial Coherence Compensating For Linewidth Variances In A Photolithography System," which is incorporated in its entirety herein by reference. McCullough et al. describe using a custom-designed optical element, such as a microlens array or a diffractive optical element, to control the partial coherence of an illumination system of a lithography device and thereby compensate for line width variances in the lithography device. The custom-designed optical element described by McCullough et al. is designed to compensate for predetermined horizontal and vertical biases associated with a particular lithography device. A limitation of the method of McCullough et al., however, is that it is typically an expensive and time-consuming process to design and manufacture the custom-designed optical element described by McCullough et al. Thus, the custom-designed optical element described by McCullough et al. cannot be readily adjusted, for example, as the horizontal and vertical biases associated with a particular lithography device change with time.

Other types of lithography devices such as step-and-repeat lithography devices and field-stitching lithography devices also exhibit horizontal and vertical biases that cause line width variances. Compensating for the horizontal and vertical biases in these lithography devices and improving line width control is just as important as compensating for horizontal and vertical biases and improving line width control in a step-and-scan lithography device.

What is needed is a system and method for controlling line width variations in a lithography device that overcomes the limitations described above.

BRIEF SUMMARY OF THE INVENTION

The present invention provides a system and method for controlling line width variances in a lithography device. Electromagnetic energy is emitted from an illumination source. A portion of the emitted electromagnetic energy passes through an illumination optics module. In an embodiment, the illumination optics module includes a one-dimensional optical transform element having a pupil plane. An aperture device having an aperture is located proximate to the pupil plane so that a portion of any electromagnetic energy received by the one-dimensional optical transform element passes through the aperture of the aperture device. The angular distribution of electromagnetic energy passing through the illumination optics module is controlled using the aperture device.

In an embodiment, electromagnetic energy exiting the illumination optics module passes through a reticle stage. The reticle stage has a mask region that is adapted for holding a reticle or mask. A portion of any electromagnetic energy passing through the mask region is received by a projection optics module. Electromagnetic energy passing through a reticle or mask held by the reticle stage will enter the projection optics module and be imaged by the projection optics module on a photosensitive substrate, such as a wafer held by a wafer stage.

In embodiments of the invention, the shape of the aperture of the aperture device is adjusted to control the angular distribution of electromagnetic energy on the mask or the reticle. In one embodiment of the invention, the shape of the aperture is static. In this embodiment, the shape of the aperture is changed by replacing at least a portion of the aperture device. In another embodiment, the shape of the aperture is dynamic. In this embodiment, the shape of the aperture is changed by using an aperture control module to adjust the shape of the aperture. The shape of the aperture can be automatically adjusted using either an open loop or a closed loop control system. In an embodiment, a measurement of the angular distribution of electromagnetic energy is used to determine an appropriate shape for the aperture.

In embodiments of the invention, a customized or standardized optical element is used in addition to the one-dimensional optical transform element and aperture device to modify the partial coherence of electromagnetic energy emitted by the illumination source. This optical element comprises, for example, micro lenses or diffractive elements that change the partial coherence of the electromagnetic energy incident upon the one-dimensional optical transform element.

In an embodiment of the invention, an adjustable delimiter (e.g., jaw or stop) is used to limit a length of the illumination field. This adjustable delimiter is a separate device from the aperture device.

Further features and advantages of the present invention, as well as the structure and operation of various embodiments of the present invention, are described in detail below with reference to the accompanying drawings.

BRIEF DESCRIPTION OF THE DRAWINGS/ FIGURES

The present invention is described with reference to the accompanying figures. The accompanying figures, which are incorporated herein and form part of the specification, illustrate the present invention and, together with the description, further serve to explain the principles of the invention and to enable a person skilled in the relevant art to make and use the invention. In the figures, like reference numbers indicate identical or functionally similar elements. Additionally, the leftmost digit or digits of a reference number identify the figure in which the reference number first appears.

Figure 6:
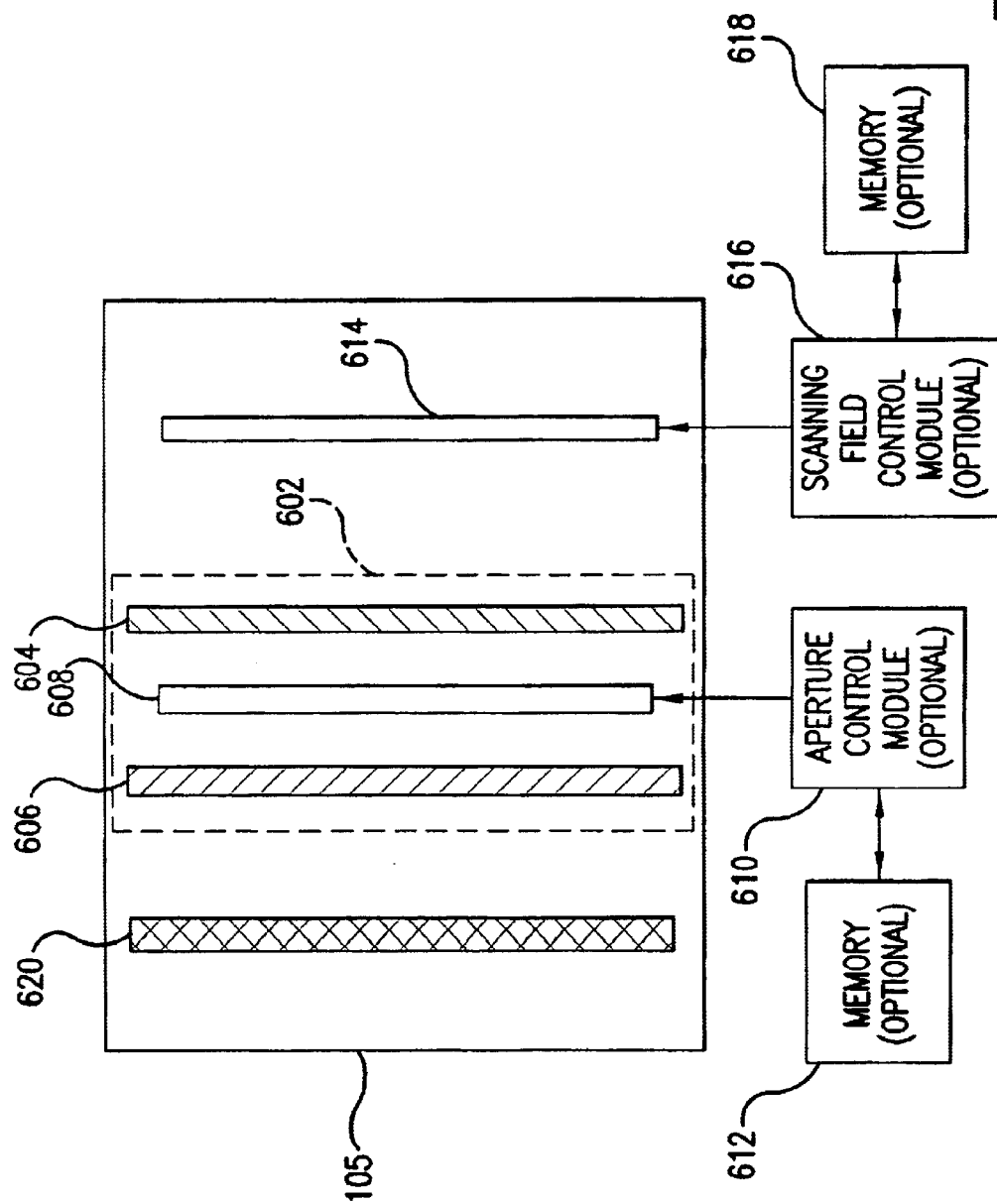
FIG. 6 illustrates an example partial coherence adjuster module according to the invention.
Figure 7:
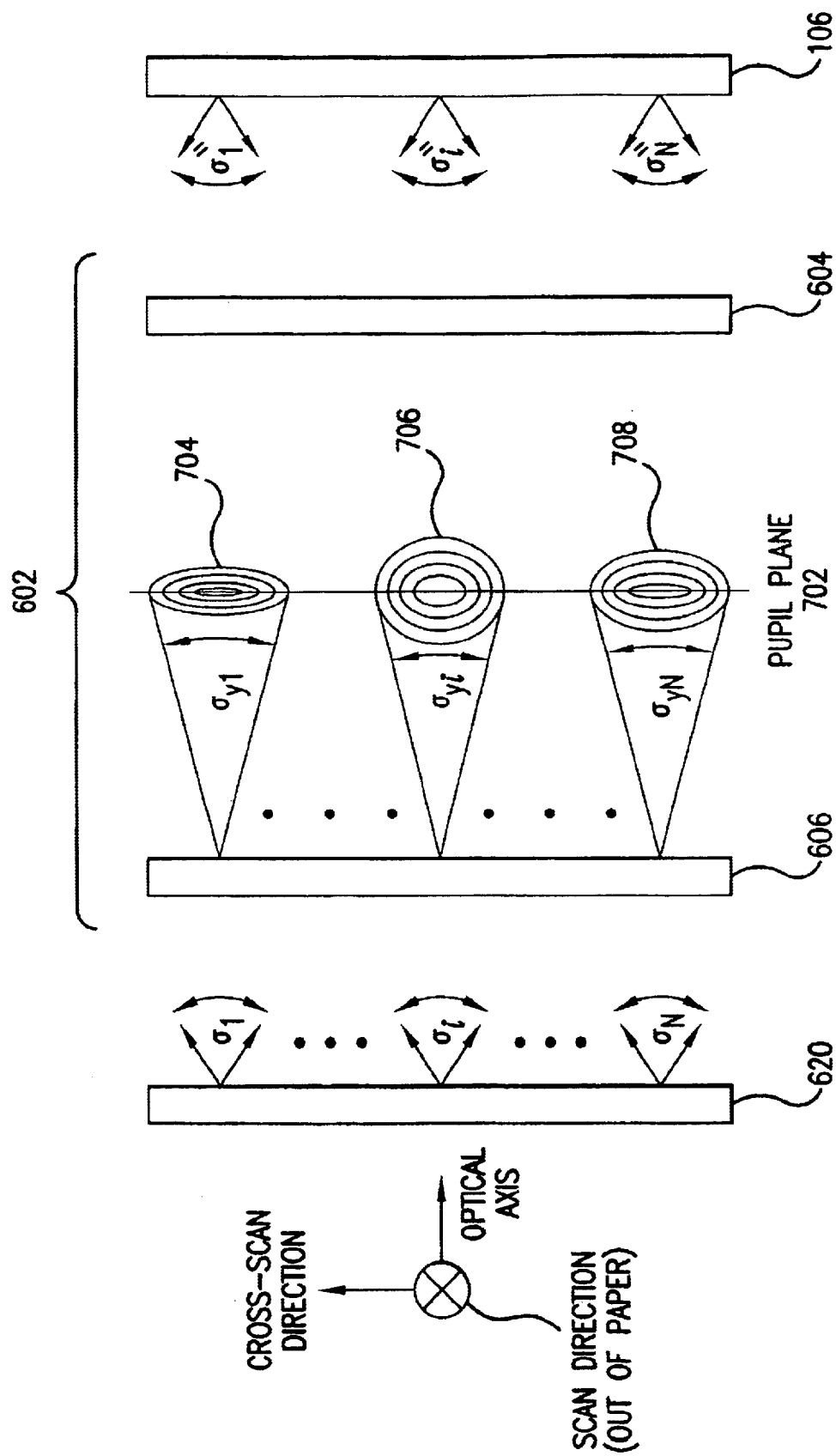

FIG. 7 further illustrates a one-dimensional optical transform element of the partial coherence adjuster of FIG. 6.

FIG. 8A illustrates a first example of an adjustable aperture according to the invention.

FIG. 8B illustrates a second example of an adjustable aperture according to the invention.

Figure 9A:
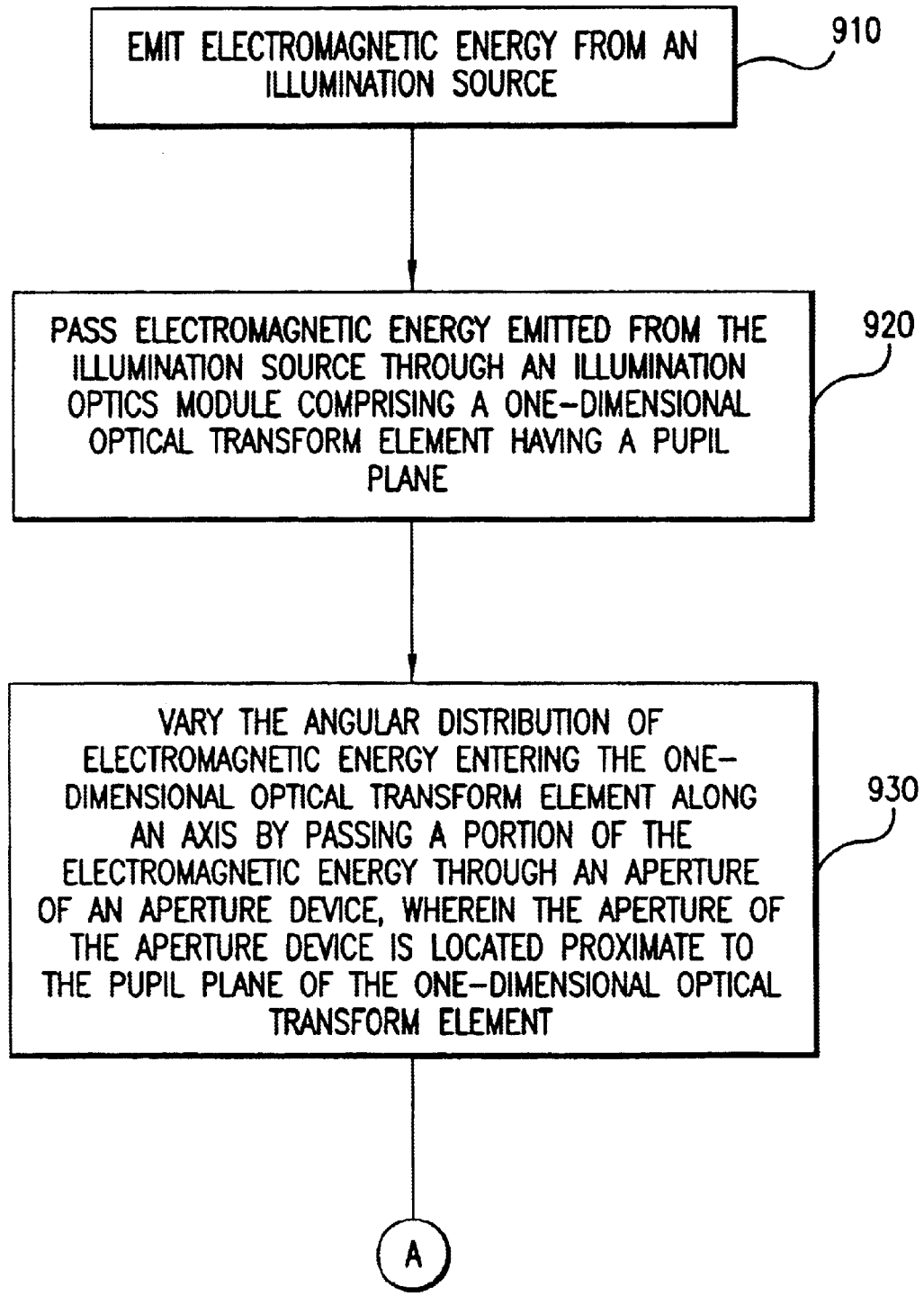
Figure 9B:
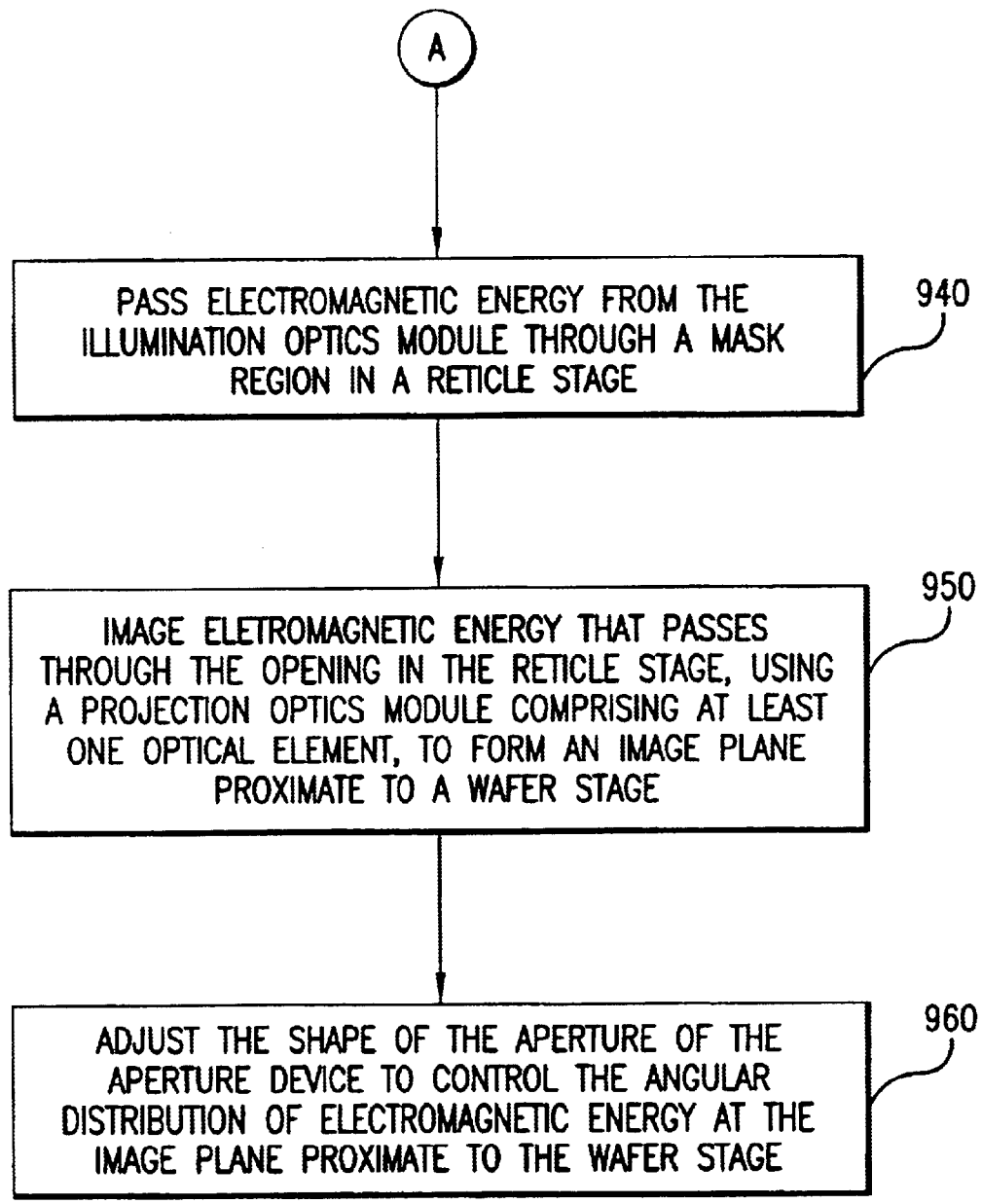

FIGS. 9A–B illustrate a flowchart of a method for controlling the angular distribution of electromagnetic energy in a lithography device as a function of field position according to an embodiment the invention.

DETAILED DESCRIPTION OF THE PREFERRED EMBODIMENTS

The present invention provides a system and method for improving linewidth control in a lithography device. As will be apparent from the detailed description herein, the present invention is particularly well adapted for use with a step-and-scan lithography device.

In the description that follows, reference will be made in detail to present embodiments of the invention, examples of which are illustrated in the accompanying drawings. While the invention will be described in conjunction with the present embodiments, it will be understood that they are not intended to limit the invention to just these embodiments. On the contrary, the invention is intended to cover alternatives, modifications and equivalents, which can be included within the spirit and scope of the invention as defined by the appended claims. Furthermore, in the following description, for purposes of explanation, numerous specific details are set forth in order to provide a thorough understanding of the present invention. It will be obvious, however, to one skilled in the art, upon reading this disclosure, that the present invention can be practiced without these specific details. In other instances, well-known structures and devices are not described in detail in order to avoid obscuring aspects of the present invention.

Terminology

The following terms are defined so that they may be used to describe embodiments of the present invention. As used herein:

"Aperture device" means a device capable of changing or varying the angular distribution of electromagnetic energy along a predetermined axis by changing or varying the shape of an aperture. An aperture device can be a dynamic device such as the invention described in U.S. Pat. No. 6,013,401 to McCullough et al., and variations thereof, or it can be a static device such as a plate or disk having an aperture of a predetermined shape and size.

"Customized Optical Element" means an optical element specifically designed to compensate for the optical characteristics of a particular lithography device. Customized optical elements are not intended to be used in a lithography device other than the one for which it is specifically designed.

"Illumination source" means any source of illumination such as, for example, a pulsed laser or a lamp that is suitable for performing lithography.

"Lithography device" means any lithography device to include a step-and-scan lithography device, a step-and-repeat lithography device, and/or a field-stitching lithography device, unless otherwise noted.

"One-dimensional optical transform element" means any optical device or combination of optical devices that form a pupil plane and allow an aperture device located proximate to the pupil plane to be used to vary the angular distribution of electromagnetic energy along a predetermined axis.

"Positioned adjacent to" means a first module or device is positioned relative to a second module or device so that electromagnetic energy exiting the first module or device will enter the second module or device, either directly or indirectly. The phrase "positioned adjacent to" includes instances where one or more optical elements are used to direct electromagnetic energy exiting the first module or device into the second module or device.

"Reticle stage" means that portion of a lithography device used to hold and position a reticle or semiconductor mask.

"Standardized Optical Element" means an optical element designed to compensate for the optical characteristics particular to a specific make or model of a lithography device. Standardized optical elements are intended to be used interchangeably in all lithography devices conforming to a specific make or model.

"Wafer" or "Photosensitive Substrate" both mean a wafer having a photosensitive coating (photoresist) of the type used by semiconductor manufacturers to produce semiconductor chips.

"Wafer stage" means that portion of a lithography device used to hold and position a wafer.

System Embodiments of the Invention

Figure 1:
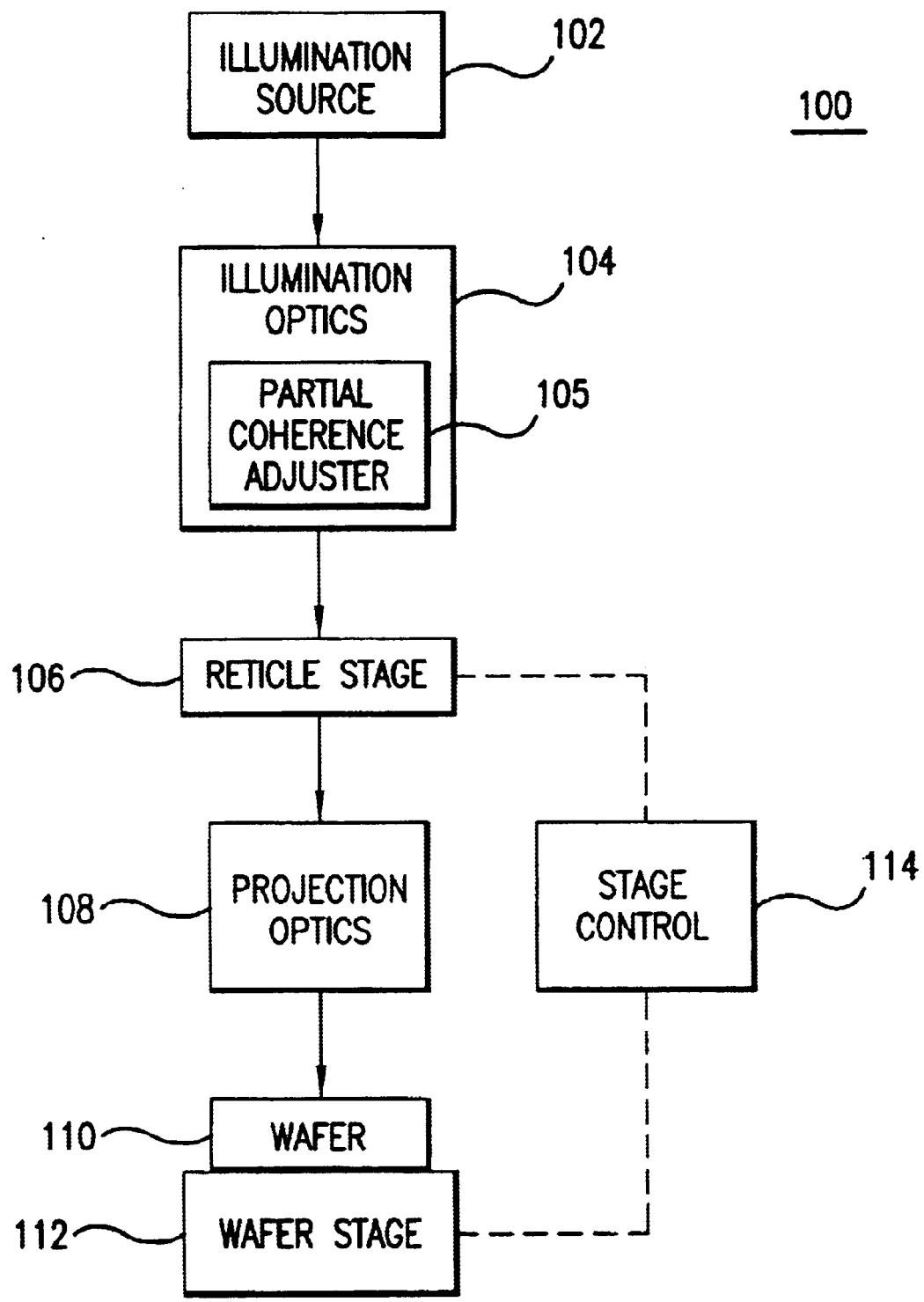
FIG. 1 illustrates an example lithography device that incorporates the invention.

FIG. 1 illustrates an example lithography device 100 that embodies the invention. An illumination source 102 generates and directs electromagnetic energy into an illumination optics module 104. Illumination optics module 104 includes a partial coherence adjuster module 105 that conditions the electromagnetic energy received from illumination source 102 in accordance with the invention. Conditioned electromagnetic energy leaves illumination optics module 104 and passes through a reticle (not shown) held by a reticle stage 106. The reticle is used to project an image of a circuit onto a wafer or photosensitive substrate 110. Electromagnetic energy passing through the reticle enters a projection optics module 108. Projection optics module 108 images the received electromagnetic energy on photosensitive substrate 110. Photosensitive substrate 110 is held and moved by a wafer stage 112. A stage control 114 controls the position of reticle stage 106 and wafer stage 112, thereby controlling the position of the reticle (not shown) and photosensitive substrate 110.

Illumination source 102 comprises a source of electromagnetic energy. Illumination source 102 can be either a continuous source of electromagnetic energy or a pulsed source of electromagnetic energy. For example, a pulsed laser operating in a range from about one kilohertz to about four kilohertz can be used. As will be understood by a person skilled in the relevant lithography art, the electromagnetic energy produced by illumination source 102 requires conditioning before it is used to expose photosensitive substrate 110.

Illumination optics module 104 comprises optical elements that condition the electromagnetic energy received from illumination source 102. Optical elements that form a part of illumination optics module 104 are described below and, for example, in U.S. Pat. No. 5,631,721 to Stanton et. al., which is herein incorporated by reference in its entirety. In particular, illumination optics module 104 contains a partial coherence adjuster module 105. Partial coherence adjuster module 105 contains optical elements for varying the angular distribution of electromagnetic energy emitted by illumination source 102 as a function of field position (e.g., for varying the angular distribution of electromagnetic energy of illumination field 312, as described below). For example, partial coherence adjuster module 105 contains a one-dimensional optical transform element and an aperture device for varying the angular distribution of electromagnetic energy. In embodiments, partial coherence adjuster module 105 also contains a customized or standardized optical element for varying the angular distribution of electromagnetic energy. These features of the invention are described below in more detail.

Electromagnetic energy exiting illumination optics module 104 is used to illuminate a reticle (not shown) held by reticle stage 106. By illuminating the reticle, a circuit pattern thereon is transferred to photosensitive substrate 110. Photosensitive substrate 110 is processed in a manner known to persons skilled in the lithography arts to form one or more circuits.

Projection optics module 108 is used to image electromagnetic energy that passes through the reticle onto photosensitive substrate 110. Projection optics 108 can also be used to reduce the reticle image formed on photosensitive substrate 110.

Stage control 114 controls the movement and positioning of reticle sage 106 and wafer stage 112. Stage control 114 enables lithography device 100 to operate in either a step-and-scan mode, a step-and-repeat mode, and/or a field stitching mode.

Figure 2:
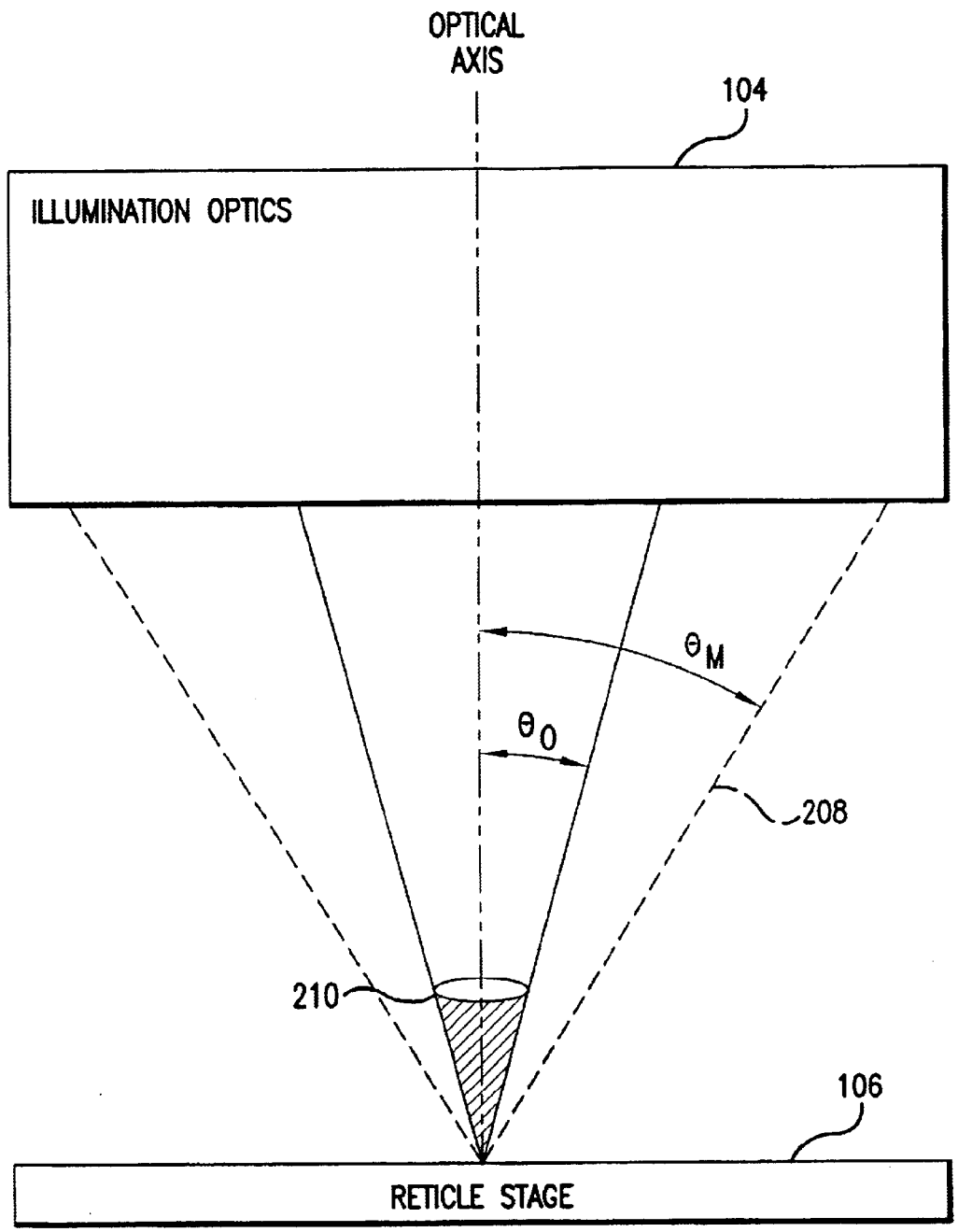
FIG. 2 illustrates how to measure the partial coherence of the lithography device of FIG. 1.

FIG. 2 illustrates how to measure the partial coherence of lithography device 100. Two cones 208 and 210 are shown in FIG. 2. Cone 210 represents the actual space through which electromagnetic energy from illumination source 102 passes to illuminate a reticle held by reticle stage 106. Cone 208 represents the maximum cone or space through which electromagnetic energy can pass and still be used to image wafer 110. The angular distribution of cone 210 (i.e., the partial coherence factor a of cone 210) is given by EQ. 1:

$$\sigma = \frac{\theta_0}{\theta_m} \quad \text{EQ. 1}$$

where, as shown in FIG. 2, cone 208 forms an angle $\theta_M$ with a optical axis of lithography device 100, and cone 210 forms an angle $\theta_0$ with the optical axis.

Figure 3:
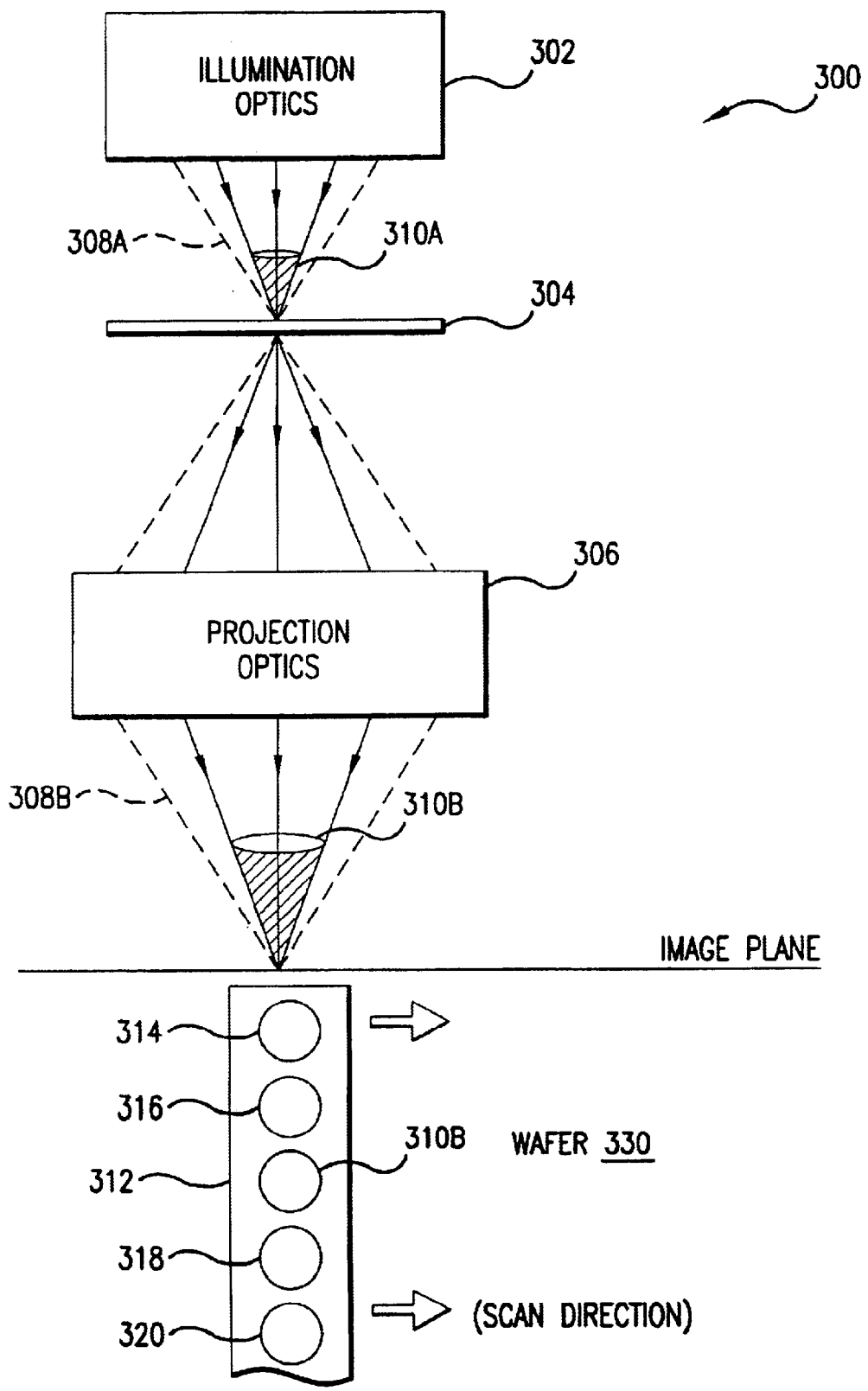
FIG. 3 illustrates the angular distribution of light in a conventional lithography device as a function of field position.

FIG. 3 illustrates the angular distribution of light in a conventional lithography device 300 as a function of field position. In FIG. 3, electromagnetic energy is shown exiting an illumination optics module 302. This exiting electromagnetic energy has not been conditioned in accordance with the invention. The exiting electromagnetic energy passes through a reticle stage 304. A reticle or semiconductor mask (not shown) is placed at an image plan of reticle stage 304. The exiting electromagnetic energy passes through a projection optics module 306. Projection optics module 306 images electromagnetic energy at an image plane located proximate to a wafer stage.

As illustrated in FIG. 3, the electromagnetic energy exiting illumination optics module 302 forms cones of electromagnetic energy (see, e.g., cone 310A). Similar cones of electromagnetic energy (see, e.g., cone 310B) are also formed by the electromagnetic energy as it exits projection optics module 306. These cones of electromagnetic energy (represented as cones 310B, 314, 316, 318, and 320) form an illumination field 312. Illumination field 312 is used to expose a photosensitive substrate of a wafer 330.

Illumination field 312 does not vary as a function of field position. Each cone of electromagnetic (e.g., 310B, 314, 316, 318, and 320) that forms a part of illumination field 312 exposes a different point on wafer 330. Cone 308B illustrates a maximum cone of electromagnetic energy that can be used to expose the photosensitive substrate of wafer 330. This cone is also shown as cone 308A. The shape (i.e., cross-sectional view) of each cone of electromagnetic (e.g., 310B, 314, 316, 318, and 320) is intended to represent the partial coherence of the electromagnetic energy at a particular point in illumination field 312.

As shown in FIG. 3, there is a relationship between the cones 308A and 308B. Changing the shape of cone 310A causes a similar change to be brought about in cone 310B. Cones 308A and 310A can be used to calculate the partial coherence of lithography device 300.

Figure 4A:
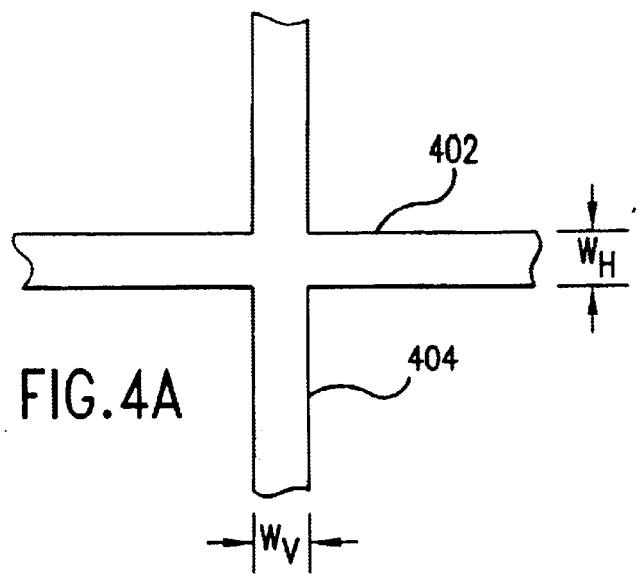
FIG. 4A illustrates an unbiased horizontal and an unbiased vertical line formed on a photosensitive substrate.
Figure 4B:
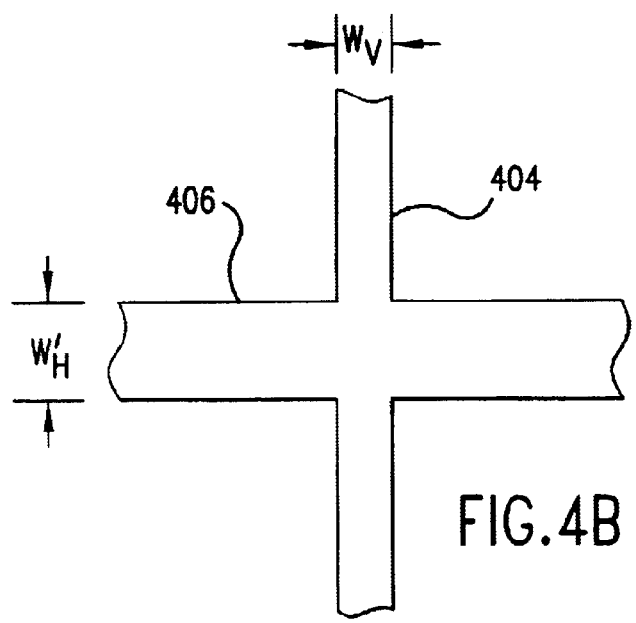
FIG. 4B illustrates a biased horizontal and an unbiased vertical line formed on a photosensitive substrate.
Figure 4C:
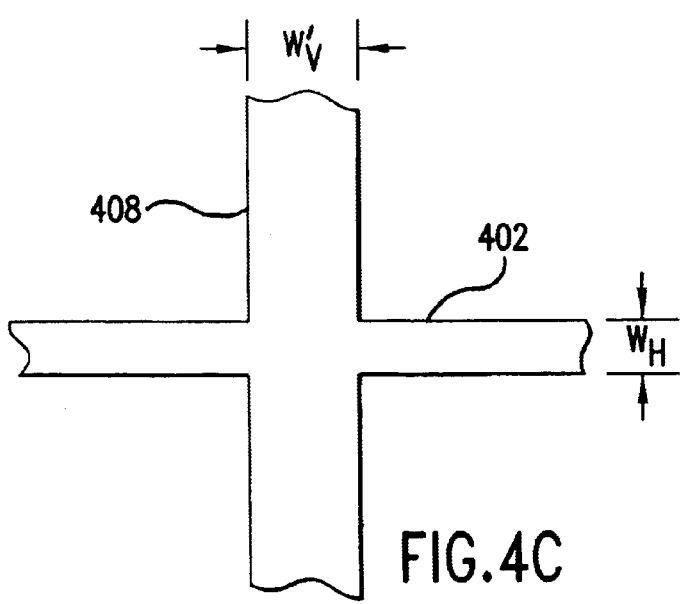
FIG. 4C illustrates an unbiased horizontal and a biased vertical line formed on a photosensitive substrate.

FIGS. 4A, 4B, and 4C illustrate horizontal line and vertical line biases. These line biases are brought about, for example, by imperfections in reticles and the optics of a conventional lithography device such as lithography device 300.

FIG. 4A illustrates an unbiased horizontal line 402 having a width $W_H$ and an unbiased vertical line 404 having a width $W_V$ formed on wafer 330.

FIG. 4B illustrates a biased horizontal line 406 having a width $W_H{'}$ and an unbiased vertical line 404 having a width $W_V$ formed on wafer 330.

FIG. 4C illustrates an unbiased horizontal line 402 having a width $W_H$ and a biased vertical line 408 having a width $W_V{'}$ formed on wafer 330.

As will become apparent to persons skilled in the relevant lithography art given the description herein, the present invention can be used to control the angular distribution or partial coherence of the electromagnetic energy in illumination field 312, as a function of field position, and thereby improve the performance of lithography device 300. By varying the partial coherence of the electromagnetic energy used to expose wafer 330 (e.g., the shape of cones 310B, 314, 316, 318, and 320) according to the invention, variations in line widths formed on wafer 330 are reduced. Embodiments of the invention are also used improve the performance of lithography devices other than lithography device 300 that use, for example, a square or an annular slit illumination field to expose a wafer.

Figure 5:
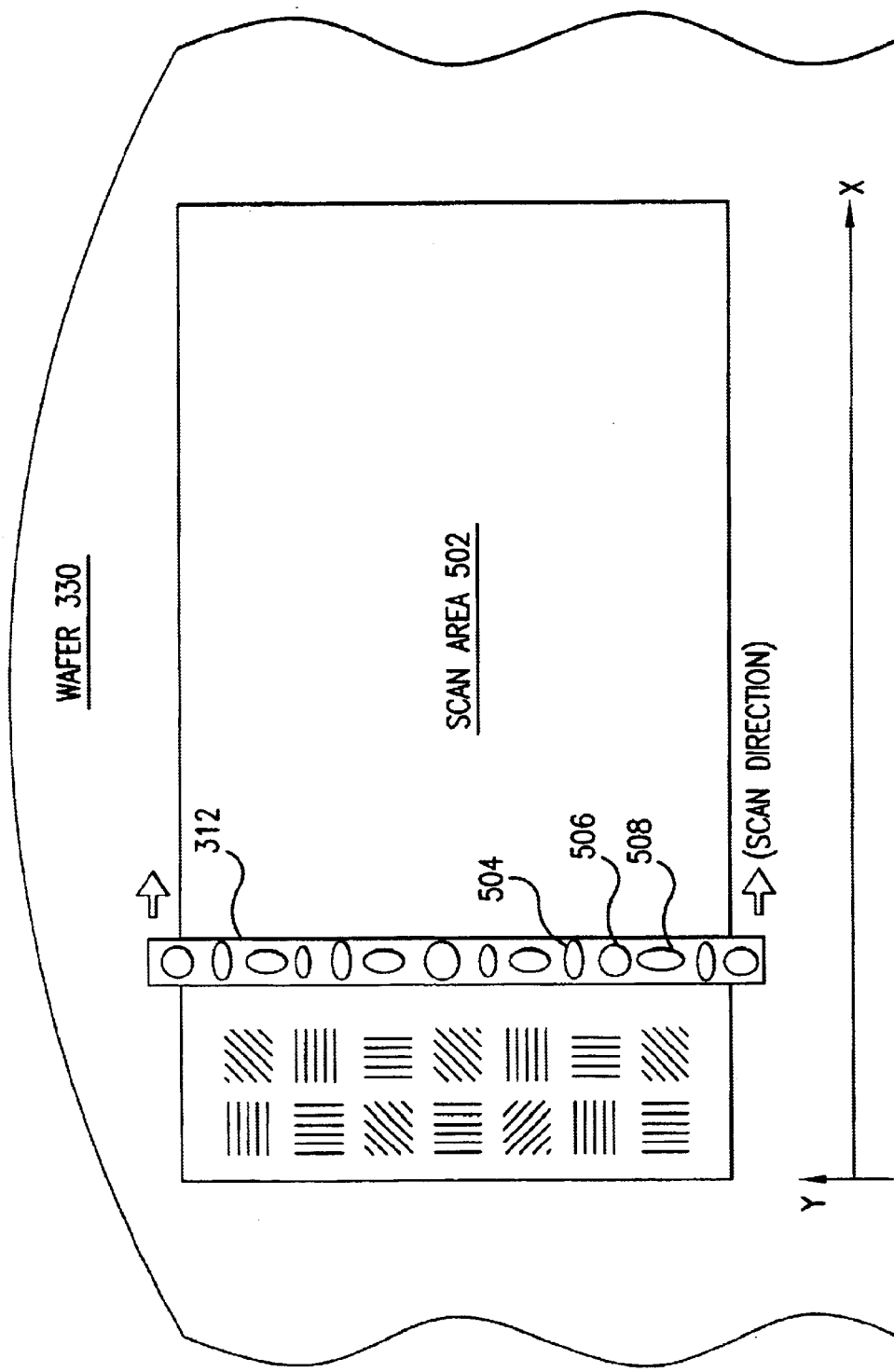
FIG. 5 illustrates an example relationship between a photosensitive substrate and an illumination field according to the invention.

FIG. 5 illustrates the relationship between wafer 330 and illumination field 312. FIG. 5 also illustrates how the invention can be used to vary the partial coherence of the electromagnetic energy used to expose wafer 330 (see, e.g., the shape of cones 504, 506, and 508) according to the invention, and thereby reduce variations in line widths formed on wafer 330.

As illustrated in FIG. 5, illumination field 312 is used to expose a scan area 502 of wafer 330. The partial coherence or angular distribution of electromagnetic energy in illumination field 312 varies as a function of field position. Each point of wafer 330 can be exposed differently along the length of illumination field 312 as illumination field 312 scans across scan area 502. Illumination cones 504, 506, and 508 depict how the angular distribution of electromagnetic energy (e.g., light) can vary as a function of illumination field position in accordance with the invention.

FIG. 6 illustrates an example partial coherence adjuster module 105 according to the invention. As described herein, partial coherence adjuster module 105 is used to adjust the partial coherence of electromagnetic energy in an illumination field (e.g., illumination field 312) as a function of field position. According to an embodiment of the invention, partial coherence adjuster module 105 includes a one-dimensional optical transform element 602, an illumination field delimiter 614, and a customized or standardized optical element 620.

As shown in FIG. 6, in an embodiment, optical transform element 602 has two optical elements (e.g., lenses) 604 and 606, and an aperture device 608. Aperture device 608 has an aperture (not shown), which is used to adjust the partial coherence of electromagnetic energy passing through the aperture along a predetermined axis. For example, optical transform element 602 can be used to vary the angular distribution of electromagnetic energy along an axis that is aligned with the length of rectangular illumination field 312, shown in FIG. 5.

In an embodiment, aperture device 608 is a device similar to the invention described in U.S. Pat. No. 6,013,401 to McCullough et al. In this embodiment, the size and shape of the aperture of the aperture device 608 can be varied in real-time to compensate for time-varying phenomena that cause horizontal line and/or vertical line biases. In an embodiment, the size and shape of apertures needed to reduce line width variation for particular sets of parameters are precomputed and stored in an optional memory 612. This stored data is then used by an optional aperture control module 610 to adjust the shape of the aperture of aperture device 608 during operation of the lithography device. Time-varying parameters that may cause linewidth variations include temperature, pressure, and resist being used. Other time-varying parameters that can be compensated for using the present invention are known to persons skilled in the relevant lithography art. Aperture control module 610 can operate in either an open loop or closed loop manner. How to implement aperture control module 610 will become apparent to a person skilled in the relevant control systems art given the description herein.

In another embodiment, aperture device 608 is a replaceable plate or a replaceable disk having a static aperture or a device that includes a replaceable plate or a replaceable disk having a static aperture. In this embodiment, the plate or disk can be changed either by hand or automatically in order to vary the shape of the aperture. Factors such as cost and the size of the circuit features being reproduced will determine when and how often the replaceable plate or replaceable disk is changed to control line width variations. In other embodiments, other known means for forming a changeable aperture, other than a replaceable plate or a replaceable disk, are used.

As will be understood by a person skilled in the relevant lithography art given the description herein, the shape of the aperture of aperture device 608 needed to control line width variations for a particular set of parameters can be determined based on a analysis experimental data obtain from exposing several wafers over time and under different conditions. The data needed can be obtained, for example, by analyzing the variations in printed line widths formed on wafers and the corresponding line widths on the reticles used to expose the wafers. How to collect the data and analyze the data are known to persons skilled in the relevant arts.

Illumination field delimiter 614 is used to set the maximum size and shape of the illumination field used to expose wafer 330. In embodiments of the invention, the size and shape of the illumination field formed by delimiter 614 is controlled by an optional scanning field control module 616 and an optional memory 618. This feature is used, for example, to control the amount of electromagnetic energy used to image a particular reticle.

In embodiments of the invention, a customized or standardized optical element 620 is used to modify the partial coherence of electromagnetic energy emitted by illumination source 102. Optical element 620 comprises, for example, micro lenses or diffractive elements that change the partial coherence of the electromagnetic energy incident upon optical element 620. Optical element 620 is designed to compensate for changes in the partial coherence of electromagnetic energy brought about, for example, by imperfections in projection optics module 108 that lead to horizontal and vertical line width biases.

A customized optical element 620 is described in detail in U.S. patent application Ser. No. 09/599,383 by McCullough et al.

Designing optical element 620 to compensate for the average or typical imperfections of a particular model of lithography devices has many advantages. For example, it reduces production costs and production time. Optical element 620 does not compensate for time-varying phenomena that cause horizontal line and vertical line biases.

FIG. 7 illustrates a pupil plane 702 that is formed by the two optical elements 604 and 606 of one-dimensional optical transform element 602. The aperture of aperture device 608 is located between optical elements 604 and 606 proximate to pupil plane 702. This placement allows the aperture of aperture device 608 to be used to vary the partial coherence of the electromagnetic energy that passes through the aperture (e.g., by varying the shape of the cones of electromagnetic radiation 704, 706, and 708) in the manner described herein.

FIGS. 8A and 8B illustrate two example apertures 801 and 811 that can be used according to the invention to vary the partial coherence of electromagnetic energy along an axis. When aperture 801 or 811 is located proximate to pupil plane 702 of one-dimensional transform element 602, it will vary the angular distribution of the electromagnetic energy (e.g., light) as a function of field position in an illumination field. For example, when the invention is incorporated into lithography device 300, aperture 801 or 811 will vary the angular distribution of the electromagnetic energy as a function of field position in illumination field 312.

For aperture 801, the angular distribution of electromagnetic energy in illumination field 312 will have a certain value "A" in a region corresponding to the area between edges 802 and 810 of aperture 801. The angular distribution of electromagnetic energy in illumination field 312 will have a value greater than "A" in the regions corresponding to the areas between edges 804 and 810 and edges 808 and 810 of aperture 801. It will have a value less than "A" in a region corresponding to the area between edges 802 and 810 of aperture 801.

Similarly, for aperture 811, the angular distribution of electromagnetic energy in illumination field 312 will have a certain value "B" in a region corresponding to the area between edges 812A and 812B of aperture 811. The angular distribution of electromagnetic energy in illumination field 312 will have a value greater than "B" in the regions corresponding to the areas between edges 814A and 814B and edges 818A and 818B of aperture 811. It will have a value less than "B" in a region corresponding to the area between edges 816A and 816B of aperture 811. Thus, as will be understood by person skilled in the relevant lithography art given the description herein, the invention improves linewidth control in a lithography device by varying the angular distribution of light in an illuminator as a function of field position.

METHOD EMBODIMENT OF THE INVENTION

FIGS. 9A and 9B illustrate a flowchart of the steps of a method 900 for controlling the angular distribution of electromagnetic energy in a lithography device as a function of field position according to an embodiment the invention. The steps of method 900 will now be described.

In step 910, electromagnetic energy from an illumination source is emitted. The emitted electromagnetic energy (e.g., light) can be either a continuous source of electromagnetic energy or a pulsed source of electromagnetic energy. In an embodiment, a pulsed laser operating in a range from about one kilohertz to about four kilohertz is used.

In step 920, electromagnetic energy emitted from the illumination source passes through an illumination optics module. This illumination optics module includes a partial coherence adjuster module. The Partial coherence adjuster module includes a one-dimensional optical transform element. The purpose of the optics module is to condition the electromagnetic energy so that is can be used to illuminate a reticle or mask and image a circuit pattern on a wafer.

In step 930, the angular distribution of electromagnetic energy entering the one-dimensional optical transform element is varied along an axis. This is accomplished by passing a portion of the electromagnetic energy through an aperture of an aperture device. The aperture of the aperture device is located proximate to a pupil plane of the one-dimensional optical transform element.

In step 940, electromagnetic energy from the illumination optics module passes through a mask region in a reticle stage. In operation, the mask region of the reticle stage holds a reticle or mask. By illuminating the reticle, a circuit pattern thereon is transferred to a photosensitive substrate of a wafer.

In step 950, electromagnetic energy that passes through the mask region in the reticle stage is imaged, using a projection optics module, to form an image plane proximate to a wafer stage. In embodiments, the projection optics module reduces the size of the reticle features transferred to the photosensitive substrate. For example, in an embodiment, the projection optics module reduces the size of the reticle features transferred to the photosensitive substrate by a factor of four.

In step 960, the shape of the aperture of the aperture device is adjusted to control the angular distribution of electromagnetic energy at the image plane proximate to the wafer stage. In an embodiment, the aperture of the aperture device is a dynamic aperture. This dynamic aperture is adjusted by changing the shape of the aperture using an aperture control module. The aperture control module can be an open-loop control system that is used to adjust the shape of the aperture, or a closed-loop control system that is used to adjust the shape of the aperture. In an embodiment, precalculated data stored in a memory is used to adjust the shape of the aperture device. The shape of the aperture is adjusted based on the angular distribution of electromagnetic energy at the image plane proximate to the wafer stage. In another embodiment, the aperture of the aperture device is a static aperture. This static aperture is changed by replacing at least a portion of the aperture device to adjust the shape of the aperture. For example, in embodiments, a plate or a disk having a predetermined cut-out (aperture) is replaced by another plate or disk having a different shaped cut-out (aperture).

In embodiments of the invention, the shape of the aperture is adjusted based on detected variations in printed line widths formed on a photosensitive substrate (wafer) held by the wafer stage. For example, the detected variations in printed line widths can be compared to the reticle used to expose the photosensitive substrate, and the shape of an aperture according to the invention that will reduce the variations in line widths can be determined. This detection and analysis process can be done on a continuous basis, or it can be done periodically (e.g., from time-to-time) by analyzing changes in line width variation on wafers over time. In embodiments, the shape of the aperture is adjusted so that is corresponds to a particular reticle being used.

As will be understood by a person skilled in the relevant lithography art, there are many factors that can be used to determine how the aperture of the aperture device should be adjusted in order to improve line width control in accordance with the invention. Thus, the factors discussed herein have been presented by way of example only, and not limitation.

CONCLUSION

Various embodiments of the present invention have been described above. It should be understood that these embodiments have been presented by way of example only, and not limitation. It will be understood by those skilled in the relevant art that various changes in form and details of the embodiments described above may be made without departing from the spirit and scope of the present invention as defined in the claims. Thus, the breadth and scope of the present invention should not be limited by any of the above-described exemplary embodiments, but should be defined only in accordance with the following claims and their equivalents.

What is claimed is:

1. A lithography device, comprising:
    an illumination source;
    an illumination optics module that receives electromagnetic energy emitted by said illumination source, said illumination optics module having a partial coherence adjuster module with a one-dimensional optical transform element that forms a pupil plane, said one-dimensional optical transform element having an aperture device with an aperture located proximate to the pupil plane of said one-dimensional optical transform element that varies the angular distribution of electromagnetic energy entering said one-dimensional optical transform element along an axis;

a reticle stage positioned adjacent to said illumination optics module, wherein electromagnetic energy exiting said illumination optics module will illuminate a portion of a reticle held by said reticle stage;

a wafer stage; and a projection optics module having an image plane proximate to said wafer stage, said projection optics module positioned adjacent to said reticle stage and adjacent to said wafer stage, wherein electromagnetic energy passing through the reticle held by said reticle stage will enter said projection optics module and be imaged by said projection optics module on a photosensitive substrate of a wafer held by said wafer stage, and wherein a shape of the aperture of said aperture device is adjusted to control the angular distribution of electromagnetic energy at the image plane proximate to said wafer stage.

2. The device of claim 1, wherein the shape of the aperture is adjusted based on detected variations in printed line widths formed on the photosensitive substrate of the wafer from corresponding line widths on the reticle.

3. The device of claim 1, wherein
the shape of the aperture is static, and
the shape of the aperture is adjusted by replacing at least a portion of said aperture device.

4. The device of claim 1, wherein
the shape of the aperture is dynamic, and
the shape of the aperture is adjusted using an aperture control module.

5. The device of claim 4, wherein an open-loop control system is used to adjust the shape of the aperture.

6. The device of claim 4, wherein a closed-loop control system is used to adjust the shape of the aperture.

7. The device of claim 1, wherein said aperture device is an adjustable slit device.

8. The device of claim 1, further comprising:
a memory that stores precalculated data used to adjust the shape of the aperture of the aperture device.

9. The device of claim 1, wherein said partial coherence adjuster module further comprises:
an optical element having a plurality of different illumination regions, each of the different illumination regions having a different illumination property selected to reduce line width variations on a printed substrate, said optical element being located adjacent to said one-dimensional optical transform element, wherein electromagnetic energy exiting from said optical element will enter said one-dimensional optical transform element.

10. A method for controlling the angular distribution of electromagnetic energy in a lithography device as a function of field position, the method comprising the steps of:

(1) emitting electromagnetic energy from an illumination source;

(2) passing electromagnetic energy emitted from the illumination source through an illumination optics module comprising a one-dimensional optical transform element having a pupil plane;

(3) passing a portion of the electromagnetic energy through an aperture of an aperture device to vary the angular distribution of electromagnetic energy entering the one-dimensional optical transform element along an axis, wherein the aperture of the aperture device is located proximate to the pupil plane of the one-dimensional optical transform element;

(4) passing electromagnetic energy from the illumination optics module through a mask region in a reticle stage;

(5) imaging electromagnetic energy that passes through the mask region in the reticle stage, using a projection optics module comprising at least one optical element, to form an image plane proximate to a wafer stage; and (6) adjusting the shape of the aperture of the aperture device to control the angular distribution of electromagnetic energy at the image plane proximate to the wafer stage.

11. The method of claim 10, wherein step (6) comprises:
adjusting the shape of the aperture based on detected variations in printed line widths formed on a photosensitive substrate held by the wafer stage from corresponding line widths on a reticle held by the reticle stage.

12. The method of claim 11, wherein step (6) comprises:
for a static aperture, replacing at least a portion of the aperture device to adjust the shape of the aperture.

13. The method of claim 11, wherein step (6) comprises:
for a dynamic aperture, adjusting the shape of the aperture using an aperture control module.

14. The method of claim 13, wherein step (6) comprises:
using an open-loop control system to adjust the shape of the aperture.

15. The method of claim 13, wherein step (6) comprises:
using a closed-loop control system to adjust the shape of the aperture.

16. The method of claim 13, wherein step (6) comprises:
adjusting the shape of the aperture based on the angular distribution of electromagnetic energy at the image plane proximate to the wafer stage.

17. The method of claim 13, wherein step (6) comprises:
using precalculated data stored in a memory to adjust the shape of the aperture device.

18. The method of claim 10, further comprising the step of:
passing electromagnetic energy emitted from the illumination source through an optical element having a plurality of different illumination regions.

19. An apparatus for improving line width control in a lithography device, comprising a one-dimensional optical transform element that forms a pupil plane, said one-dimensional optical transform element having an aperture device with an aperture located proximate to the pupil plane of said one-dimensional transform element that varies the angular distribution of electromagnetic energy entering said one-dimensional optical transform element along an axis.

20. The apparatus of claim 19, further comprising:
an optical element that changes the partial coherence of electromagnetic energy entering said one-dimensional optical transform element, said customized optical element having a plurality of different illumination regions, each of the different illumination regions having a different illumination property selected to reduce line width variations on a printed substrate.

21. The apparatus of claim 19, wherein the shape of the aperture is adjusted based on detected variations in printed line widths formed on a photosensitive substrate of a wafer from corresponding line widths on a reticle.

22. The apparatus of claim 19, wherein
the shape of the aperture is static, and
the shape of the aperture is adjusted by replacing at least a portion of said aperture device.

23. The apparatus of claim 19, wherein
the shape of the aperture is dynamic, and
the shape of the aperture is adjusted using an aperture control module.

24. The apparatus of claim 23, wherein an open-loop control system is used to adjust the shape of the aperture.

25. The apparatus of claim 23, wherein a closed-loop control system is used to adjust the shape of the aperture.

26. The apparatus of claim 19, wherein said aperture device is an adjustable slit device.

27. The apparatus of claim 19, further comprising:

a memory that stores precalculated data used to adjust the shape of the aperture of the aperture device.

* * * * *